United States Patent
Nagai et al.

(10) Patent No.: US 9,837,558 B2
(45) Date of Patent: Dec. 5, 2017

(54) PHOTOVOLTAIC MODULE AND PHOTOVOLTAIC PANEL

(71) Applicant: Sumitomo Electric Industries, Ltd., Osaka-shi (JP)

(72) Inventors: Youichi Nagai, Osaka (JP); Takashi Iwasaki, Osaka (JP); Kazumasa Toya, Osaka (JP); Kenji Saito, Osaka (JP); Kenichi Hirotsu, Osaka (JP); Hideaki Nakahata, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/422,869

(22) PCT Filed: Mar. 12, 2014

(86) PCT No.: PCT/JP2014/056489
§ 371 (c)(1),
(2) Date: Feb. 20, 2015

(87) PCT Pub. No.: WO2014/156649
PCT Pub. Date: Oct. 2, 2014

(65) Prior Publication Data
US 2015/0243797 A1 Aug. 27, 2015

(30) Foreign Application Priority Data
Mar. 26, 2013 (JP) .................... 2013-063681

(51) Int. Cl.
*H01L 31/02* (2006.01)
*H01L 31/05* (2014.01)
(Continued)

(52) U.S. Cl.
CPC ...... *H01L 31/0201* (2013.01); *H01L 31/0203* (2013.01); *H01L 31/02008* (2013.01);
(Continued)

(58) Field of Classification Search
CPC ............ H01L 31/0201; H01L 31/0543; H01L 31/0203; H01L 31/0508
See application file for complete search history.

(56) References Cited

U.S. PATENT DOCUMENTS

| | | | | |
|---|---|---|---|---|
| 5,869,219 A | * | 2/1999 | Kuo ...................... | B05D 3/0486 257/E21.259 |
| 2011/0132432 A1 | * | 6/2011 | Schultz ................. | H01L 31/052 136/246 |

FOREIGN PATENT DOCUMENTS

| | | |
|---|---|---|
| JP | 2002-289900 A | 10/2002 |
| JP | 2003-174179 A | 6/2003 |

(Continued)

OTHER PUBLICATIONS

International Search Report issued in PCT Application No. PCT/JP2014/056489 dated Apr. 15, 2014.

*Primary Examiner* — Shannon Gardner
(74) *Attorney, Agent, or Firm* — Venable LLP; Michael A. Sartori; Laura G. Remus

(57) ABSTRACT

A concentrator photovoltaic module 1M includes a vessel-shaped housing 11 composed of a metal and a flexible printed wiring board 12 provided so as to be in contact with an inner surface of the housing 11. The flexible printed wiring board 12 includes an insulating layer 124, an insulating substrate 121a, a pattern 121b, a plurality of power generation elements 122, and an insulting layer 126. The insulating layer 124 is in contact with a bottom surface 11a of the housing 11. The insulating substrate 121a is provided on the insulating layer 124 and has flexibility. The pattern 121b is composed of a conductor and is provided on the insulating substrate 121a. The plurality of power generation elements 122 are mounted on the pattern 121b. The insulating layer 126 is provided so as to cover an entire surface (Continued)

of the pattern 121*b* except for portions where the power generation elements 122 are mounted.

11 Claims, 6 Drawing Sheets

(51) Int. Cl.
*H01L 31/054* (2014.01)
*H01L 31/0203* (2014.01)
*H01L 31/048* (2014.01)
*H02S 40/22* (2014.01)

(52) U.S. Cl.
CPC ........ *H01L 31/048* (2013.01); *H01L 31/0504* (2013.01); *H01L 31/0508* (2013.01); *H01L 31/0512* (2013.01); *H01L 31/0543* (2014.12); *H02S 40/22* (2014.12); *Y02E 10/52* (2013.01)

(56) References Cited

FOREIGN PATENT DOCUMENTS

| | | |
|---|---|---|
| JP | 2008-091440 A | 4/2008 |
| WO | WO-2008/050392 A1 | 5/2008 |
| WO | WO-2010/027083 A1 | 3/2010 |
| WO | WO-2011/065975 A1 | 6/2011 |
| WO | WO-2013/051426 A1 | 4/2013 |

* cited by examiner

PHOTOVOLTAIC MODULE AND PHOTOVOLTAIC PANEL

TECHNICAL FIELD

The present invention relates to a photovoltaic module including power generation elements that generate power by receiving sunlight.

BACKGROUND ART

A photovoltaic device (photovoltaic module) has been proposed in which a plurality of solar cells (power generation elements) and a metal line that electrically connects the solar cells together are bonded on a metal plate with a resin insulating layer therebetween (refer to PTL 1). In this device, most of the surface of the metal line is exposed without being covered with an insulating layer.

In addition, a photovoltaic unit (photovoltaic module) has been proposed in which a solar cell element (power generation element) and a metal line for extracting a current generated in the solar cell element are mounted on a metal base substrate with an insulating layer therebetween (refer to PTL 2). In this unit, a part of the surface of the metal line is covered with an insulating layer, the part being other than a part to which a wire or the like is connected from the outside. The base substrate is fixed to a solar-cell-mounting substrate composed of a metal.

CITATION LIST

Patent Literature

PTL 1: Japanese Unexamined Patent Application Publication No. 2003-174179
PTL 2: Japanese Unexamined Patent Application Publication No. 2008-91440

SUMMARY OF INVENTION

Technical Problem

A photovoltaic module is required to have a particular level or higher of a withstand voltage between a metal line and a metal plate (base substrate or solar-cell-mounting substrate) from the viewpoint of ensuring safety during the use thereof. The level of the withstand voltage is specified in the International Electrotechnical Commission (IEC) 62688 standard. Specifically, dielectric breakdown should not occur in a withstand voltage test in which a predetermined voltage (for example, 6 kV) is applied between a metal line and a metal plate (base substrate or solar-cell-mounting substrate).

However, in the structures described in PTL 1 and PTL 2, at least a part of the metal line is exposed without being covered with a resin layer. Accordingly, in a case where a voltage is applied between the metal line and the metal plate (base substrate or solar-cell-mounting substrate), dielectric breakdown (creeping discharge) easily occurs in a path extending from an exposed portion in the metal line to the metal plate or the like through a surface of the resin layer. Thus, the withstand voltage between the metal line and the metal plate may not be sufficient to the extent that the IEC62688 standard can be satisfied.

Accordingly, an object is to provide a photovoltaic module in which performance in a withstand voltage test can be improved.

Solution to Problem

A photovoltaic module according to the present invention includes a vessel-shaped housing composed of a metal material, and a flexible printed wiring board provided so as to be in contact with an inner surface of the housing, in which the flexible printed wiring board includes a first insulating layer that is in contact with the inner surface of the housing, an insulating substrate provided on the first insulating layer and having flexibility, a pattern composed of a conductor and provided on the insulating substrate, a plurality of power generation elements mounted on the pattern, and a second insulating layer provided so as to cover an entire surface of the pattern except for portions where the power generation elements are mounted. The first insulating layer is composed of a resin material, and an average volume of an air bubble or a foreign substance present in the first insulating layer is a first volume or less, so that dielectric breakdown does not occur in a first path extending from the pattern to the housing through any portion of the inside of the first insulating layer in a case where a voltage equal to or less than a predetermined voltage is applied between the pattern and the housing. Alternatively, the second insulating layer is composed of a resin material, and an average volume of an air bubble or a foreign substance present in the second insulating layer is a second volume or less, so that dielectric breakdown does not occur in a second path extending from the pattern to the housing through any portion of the inside of the second insulating layer in a case where a voltage equal to or less than a predetermined voltage is applied between the pattern and the housing.

According to this structure, the second insulating layer is provided so as to cover an entire surface of the pattern except for portions where the power generation elements are mounted. With this structure, at least one of the insulating substrate, the first insulating layer, and the second insulating layer is interposed between the pattern and the housing. Thus, a withstand voltage between the pattern and the housing can be improved compared with a structure in which these are not interposed between the pattern and the housing.

Furthermore, according to this structure, by controlling the size of an air bubble or a foreign substance present in the first insulating layer to the first volume or less, the occurrence of dielectric breakdown can be prevented in a path extending from the pattern to the housing through any portion of the inside of the first insulating layer in a case where a voltage equal to or less than a predetermined voltage is applied between the pattern and the housing. Similarly, by controlling the size of an air bubble or a foreign substance present in the second insulating layer to the second volume or less, the occurrence of dielectric breakdown can be prevented in a path extending from the pattern to the housing through any portion of the inside of the second insulating layer in a case where a voltage equal to or less than a predetermined voltage is applied between the pattern and the housing. Consequently, the IEC62688 standard can be easily satisfied in a withstand voltage test.

Advantageous Effects of Invention

The present invention can provide a photovoltaic module in which performance in a withstand voltage test can be improved.

Figure 1:
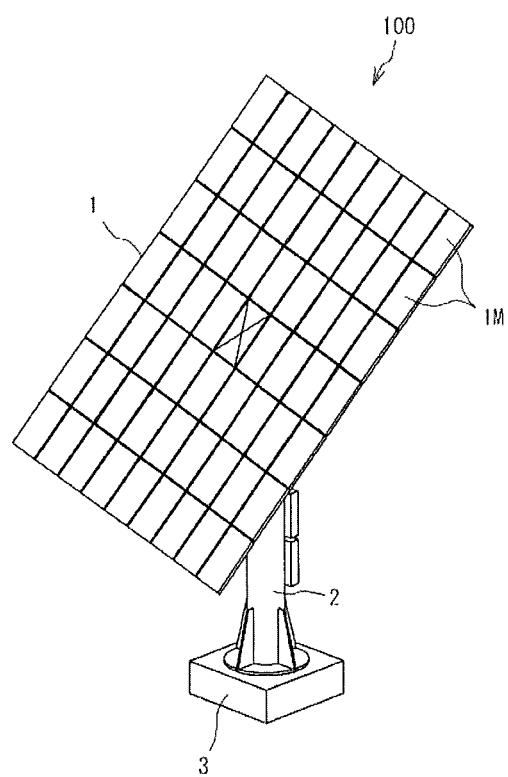
FIG. 1 is a perspective view showing a concentrator photovoltaic device according to an embodiment.

REFERENCE SIGNS LIST 1 concentrator photovoltaic panel
1M concentrator photovoltaic module
11 housing
11a bottom surface
11b flange portion
12 flexible printed wiring board
12A wiring board for power generation
12Bn wiring board for connection
12Bp wiring board for connection
121a insulating substrate
121b pattern
121c edge
122 power generation element
122c element portion
122e electrode
122p package
124 insulating layer (first insulating layer)
126 insulating layer (second insulating layer)
128 coverlay (covering layer)
129 resin film
13 primary concentrating portion
13f Fresnel lens
14 connector
P positive-side electrode
N negative-side electrode

DESCRIPTION OF EMBODIMENTS

Gist of Embodiments

The gist of embodiments of the present invention includes at least the following.

(1) A photovoltaic module according to the present invention includes a housing and a flexible printed wiring board. The housing is composed of a metal material and has a vessel shape. The flexible printed wiring board is provided so as to be in contact with an inner surface of the housing. The flexible printed wiring board includes a first insulating layer, an insulating substrate, a pattern, a plurality of power generation elements, and a second insulating later. The first insulating layer is in contact with the inner surface of the housing. The insulating substrate is provided on the first insulating layer and has flexibility. The pattern is composed of a conductor and provided on the insulating substrate. The plurality of power generation elements are mounted on the pattern. The second insulating layer is provided so as to cover an entire surface of the pattern except for portions where the respective power generation elements are mounted. The first insulating layer is composed of a resin material, and a size of an air bubble or a foreign substance present in the first insulating layer is a first volume or less, so that dielectric breakdown does not occur in a first path extending from the pattern to the housing through any portion of the inside of the first insulating layer in a case where a voltage equal to or less than a predetermined voltage is applied between the pattern and the housing. Alternatively, the second insulating layer is composed of a resin material, and a size of an air bubble or a foreign substance present in the second insulating layer is a second volume or less, so that dielectric breakdown does not occur in a second path extending from the pattern to the housing through any portion of the inside of the second insulating layer in a case where a voltage equal to or less than a predetermined voltage is applied between the pattern and the housing.

According to this structure, the second insulating layer is provided so as to cover an entire surface of the pattern except for portions where the respective power generation elements are mounted. With this structure, at least one of the insulating substrate, the first insulating layer, and the second insulating layer is interposed between the pattern and the housing. Thus, a withstand voltage between the pattern and the housing can be improved compared with a structure in which these are not interposed between the pattern and the housing. That is, performance in a withstand voltage test can be improved.

Furthermore, according to this structure, by controlling the size of an air bubble or a foreign substance present in the first insulating layer to the first volume or less, the occurrence of dielectric breakdown can be prevented in a path extending from the pattern to the housing through any portion of the inside of the first insulating layer in a case where a voltage equal to or less than a predetermined voltage is applied between the pattern and the housing. Similarly, by controlling the size of an air bubble or a foreign substance present in the second insulating layer to the second volume or less, the occurrence of dielectric breakdown can be prevented in a path extending from the pattern to the housing through any portion of the inside of the second insulating layer in a case where a voltage equal to or less than a predetermined voltage is applied between the pattern and the housing. Similarly, by controlling the size of an air bubble or a foreign substance present in the first insulating layer to the first volume or less, and controlling the size of an air bubble or a foreign substance present in the second insulating layer to the second volume or less, the occurrence of dielectric breakdown can be prevented in a path extending from the pattern to the housing through any portion of the inside of the first insulating layer and a path extending from the pattern to the housing through any portion of the inside of the second insulating layer in a case where a voltage equal to or less than a predetermined voltage is applied between the pattern and the housing. Consequently, the IEC62688 standard can be easily satisfied in a withstand voltage test.

(2) In the photovoltaic module according to the present invention, the flexible printed wiring board may further include a covering layer provided so as to cover an entire upper part of the insulating substrate and the pattern except for portions where the power generation elements are mounted, and the second insulating layer may be interposed between the insulating substrate and the covering layer and between the pattern and the covering layer.

According to this structure, since the covering layer is interposed between the pattern and the housing, a withstand voltage between the pattern and the housing can be improved compared with a structure in which the covering layer is not interposed between the pattern and the housing.

(3) In the photovoltaic module according to the present invention, the second path may be a path extending from an edge of the pattern, the edge being located on a peripheral edge side of the insulating substrate, to the housing through the inside of the second insulating layer.

In a case where a voltage is applied between the pattern and the housing, an electric field easily concentrates on an edge of the pattern, the edge being located on a peripheral edge side of the insulating substrate.

In contrast, according to this structure, the occurrence of dielectric breakdown can be suppressed in a path extending from an edge of the pattern, the edge being located on a peripheral edge side of the insulating substrate, to the housing through the inside of the second insulating layer.

(4) In the photovoltaic module according to the present invention, the first path may further extend through the inside of the insulating substrate.

According to this structure, the occurrence of dielectric breakdown can be suppressed in a path extending to the housing through the inside of the insulating substrate.

(5) In the photovoltaic module according to the present invention, the first volume and the second volume may each be equal to or less than a volume of a sphere with a diameter of 1 mm.

According to this structure, the IEC62688 standard can be satisfied in a withstand voltage test.

(6) In the photovoltaic module according to the present invention, the first volume and the second volume may each be equal to or less than a volume of a sphere with a diameter of 100 µm.

According to this structure, the IEC62688 standard can be satisfied more reliably in a withstand voltage test. In addition, the size of an air bubble or a foreign substance present in the first and second insulating layers can be controlled on the basis that whether or not an air bubble or a foreign substance can be detected by an ultrasonic microscope that uses ultrasonic waves having a frequency of several tens of MHz.

(7) In the photovoltaic module according to the present invention, the first volume and the second volume may each be equal to or less than a volume of a sphere with a diameter of 10 µm.

According to this structure, the size of an air bubble or a foreign substance present in the first and second insulating layers can be controlled on the basis that whether or not an air bubble or a foreign substance can be detected by an ultrasonic microscope that uses ultrasonic waves having a frequency of several hundreds of MHz.

(8) In the photovoltaic module according to the present invention, the insulating substrate may have a ribbon shape.

According to this structure, since the area of the insulating substrate can be reduced, a reduction in the weight can be realized.

(9) In the photovoltaic module according to the present invention, the flexible printed wiring board may include a plurality of wiring boards for power generation, the wiring boards each having at least one power generation element, and a wiring board for connection, the wiring board being separated from the plurality of wiring boards for power generation and electrically connecting the wiring boards for power generation together.

According to this structure, the flexible printed wiring board can be produced by separately preparing the wiring boards for power generation and the wiring board for connection, and then connecting these wiring boards to each other. The wiring boards for power generation and the wiring board for connection are smaller than the whole flexible printed wiring board, and are easily produced. Thus, the production can be easily performed.

(10) In the photovoltaic module according to the present invention, the insulating substrate may have a thickness of 10 to 100 µm.

According to this structure, both an improvement in the withstand voltage of the insulating substrate and an improvement in a heat dissipating property can be realized.

(11) A plurality of the photovoltaic modules according to the present invention may be combined.

According to this structure, since a plurality of photovoltaic modules are combined, the plurality of photovoltaic modules can be attached to a single tracking base together. Thus, a photovoltaic device having a high output can be easily realized.

Details of Embodiments

<1> Structure

FIG. 1 is a perspective view showing a concentrator photovoltaic device according to an embodiment of the present invention.

A concentrator photovoltaic device 100 includes a concentrator photovoltaic panel 1, a supporting column 2 that supports the concentrator photovoltaic panel 1 at a center of a back surface of the panel 1, and a base 3 to which the supporting column 2 is attached. The concentrator photovoltaic panel 1 is obtained by combining, for example, 62 ((a length of 7 by a width of 9)–1) concentrator photovoltaic modules 1M vertically and transversely except for a central part (refer to the portion marked with X in FIG. 1) for connecting to the supporting column 2. A single concentrator photovoltaic module 1M has a rated output of, for example, about 100 W, and the whole concentrator photovoltaic panel 1 has a rated output of about 6 kW. The concentrator photovoltaic panel 1 can be rotated with the supporting column 2 as an axis through a rotating mechanism which is not shown, and can cause the concentrator photovoltaic panel 1 to track so as to be constantly oriented in the direction of the sun.

Figure 2:
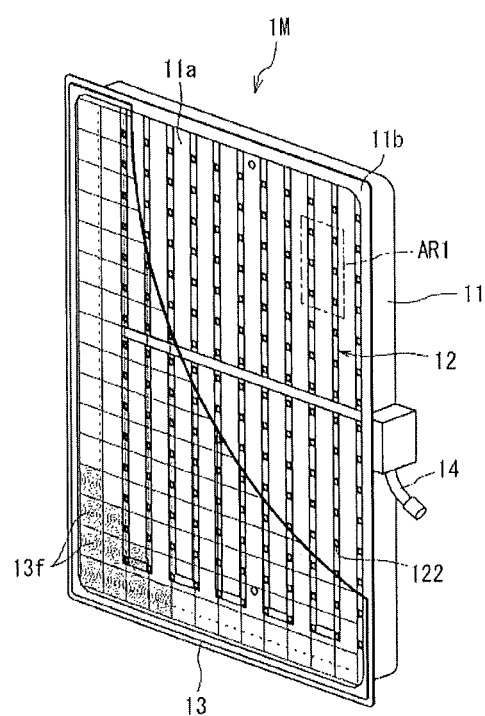
FIG. 2 is a perspective view (a part of which is broken away) showing an enlarged concentrator photovoltaic module according to an embodiment.

FIG. 2 is a perspective view (a part of which is broken away) showing an enlarged concentrator photovoltaic module (hereinafter simply referred to as a "module") 1M.

The module 1M mainly includes a housing 11, a primary concentrating portion 13 attached to a part of the housing 11, and a flexible printed wiring board 12 provided in the housing 11.

The housing 11 has a vessel shape (vat shape) having a bottom surface (inner surface) 11a. Herein, the term "vessel shape" refers to a flat, rectangular box shape, a surface of which in a thickness direction is open and in which a flange portion 11b extends from the edge of the opening to the outside. The housing 11 is composed of a metal material. An example of the metal material is aluminum. By using aluminum, the weight of the housing 11 can be reduced.

The primary concentrating portion 13 is attached to the housing 11 in such a manner that the whole periphery thereof is in contact with the flange portion 11b of the housing 11. The primary concentrating portion 13 is a so-called Fresnel lens array and is formed by arranging, in a matrix, a plurality of (for example, a length of 16 by a width of 12, i.e., 192)

Fresnel lenses 13f functioning as lens elements for concentrating sunlight. Each of the Fresnel lenses 13f is formed on a resin film covering the entire rear surface side of a glass plate used as a base material of the primary concentrating portion 13. The resin film is composed of, for example, a silicone resin or the like. A connector 14 for extracting an output of the module 1M is provided on an external surface of the housing 11.

Figure 3A:
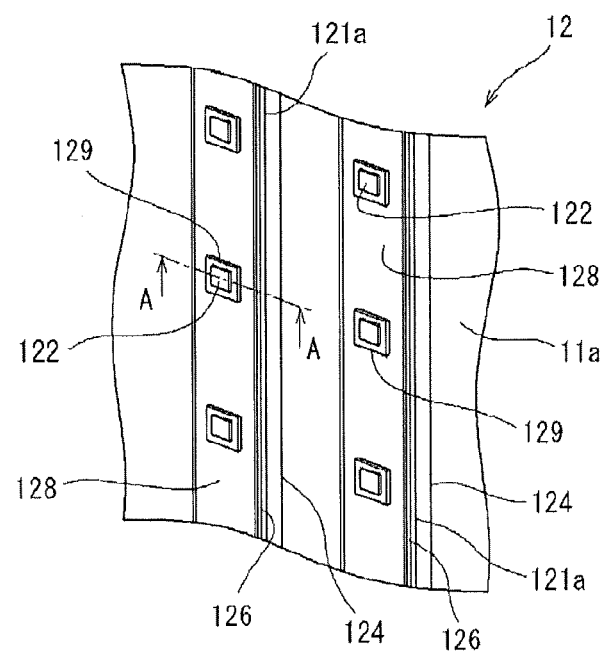
FIG. 3A shows a concentrator photovoltaic module according to an embodiment and is an enlarged view of an AR1 portion in FIG. 2.
Figure 3B:
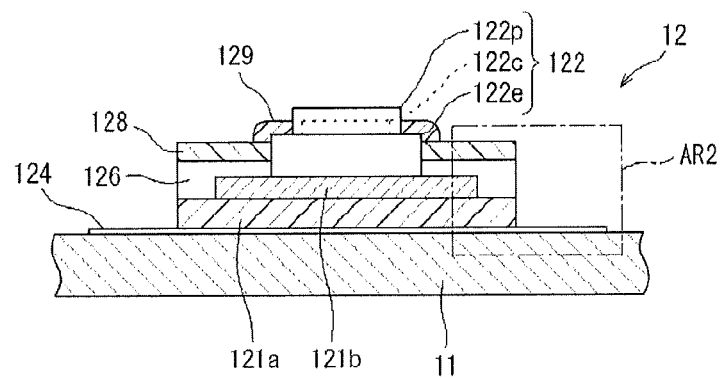
FIG. 3B shows a concentrator photovoltaic module according to an embodiment and is an arrow view of a cross section taken along line A-A in FIG. 3A.

FIG. 3A is an enlarged view of an AR1 portion in FIG. 2. FIG. 3B is an arrow view of a cross section taken along line A-A in FIG. 3A.

A flexible printed wiring board 12 includes an insulating substrate 121a, a pattern 121b, a plurality of power generation elements (solar cells) 122, insulating layers 124 and 126, and a coverlay (covering layer) 128. External shape features of the flexible printed wiring board 12 will be described in detail in the section of <Supplement> below.

The insulating substrate 121a is formed to have a ribbon shape. Herein, the term "ribbon shape" refers to a narrow and long plate shape including a U-shaped meandering portion. The insulating substrate 121a has a narrow and long plate shape and has flexibility.

The insulating substrate 121a is composed of a resin material having good heat resistance, such as polyimide. The thickness of the insulating substrate 121a is in the range of 10 to 100 µm. The reason for this is as follows. When the thickness of the insulating substrate 121a is less than 10 µm, the withstand voltage of the insulating substrate 121a is insufficient. When the thickness of the insulating substrate 121a exceeds 100 µm, a heat dissipating property from a power generation element 122 to the housing 11 is decreased. By setting the thickness of the insulating substrate 121a to the above range, both an improvement in the withstand voltage and an improvement in the heat dissipating property can be realized.

The pattern 121b is provided on the insulating substrate 121a.

The pattern 121b is composed of a metal material such as copper. The pattern 121b is formed by depositing a metal film on the insulating substrate 121a, and then pattering the metal film by using known photolithographic technique and etching technique. The pattern 121b is provided in a region inside the peripheral edges of the insulating substrate 121a in plan view. More specifically, edges of the pattern 121b, the edges being located on the peripheral edge sides of the insulating substrate 121a, are located inward from the peripheral edges of the insulating substrate 121a in plan view. The material of the pattern 121b is not limited to a metal material. Alternatively, a semiconductor material such as silicon or a conductive resin material may be used.

The power generation element 122 is mounted on the pattern 121b. The power generation element 122 includes an element portion 122c, a package 122p that houses the element portion 122c, and an electrode 122e for electrically connecting the element portion 122c to the pattern 121b. In addition, a secondary concentrating portion (not shown) for correcting a light-collection position at which sunlight is collected by the primary concentrating portion 13 so as to correspond to a light-receiving portion (not shown) of the element portion 122c is provided on the front surface side of the package 122p.

The element portion 122c may be, for example, a group III-V compound semiconductor multi junction solar cell element. The solar cell element is produced by, for example, forming a multi-junction group III-V compound semiconductor epitaxial film on a compound semiconductor substrate composed of gallium arsenide or indium phosphide or a germanium substrate.

The coverlay 128 is provided so as to cover the entire upper part of the insulating substrate 121a and the pattern 121b except for portions where the plurality of power generation elements 122 are mounted. The coverlay 128 is composed of a resin material having good insulation properties, such as polyimide, an acrylic resin, or an epoxy resin.

A boundary portion between the coverlay 128 and the power generation element 122 is covered with a resin film 129 composed of a resin material having good insulation properties, such as a silicone resin. The resin film 129 covers mainly a portion of the electrode 122e of the power generation element 122, the portion not being covered with the coverlay 128. This structure prevents dielectric breakdown from occurring in a path extending from the electrode 122e of the power generation element 122 to the housing 11 through a surface of the coverlay 128 or the like. The resin film 129 is formed by potting.

The insulating layer 124 has one surface (lower surface) which is in contact with a bottom surface 11a of the housing 11, and another surface (upper surface) on which the insulating substrate 121a is provided. The insulating layer 124 functions as an adhesive that bonds the insulating substrate 121a to the bottom surface 11a of the housing 11. The insulating layer 124 is composed of a resin material having good insulation properties, such as polyimide, an acrylic resin, a silicone resin, or an epoxy resin.

When viewed from a direction orthogonal to the bottom surface 11a of the housing 11, a peripheral edge portion of the insulating layer 124 extends to the outside of the insulating substrate 121a. With this structure, a creeping distance from the pattern 121b to the housing 11 through a front surface of the insulating substrate 121a is increased. Thus, the withstand voltage between the pattern 121b and the housing 11 can be improved.

The insulating layer 126 is provided so as to cover an entire surface of the pattern 121b except for portions where the plurality of power generation elements 122 are mounted. The insulating layer 126 is interposed between the insulating substrate 121a and the coverlay 128. The insulating layer 126 functions as an adhesive that bonds the coverlay 128 to the insulating substrate 121a. The material of the insulating layer 126 is the same as the material of the insulating layer 124.

<2> With Regard to Method for Producing Module

Next, regarding a method for producing a module 1M, in particular, a step of producing a flexible printed wiring board 12 and a step of attaching the flexible printed wiring board 12 to a housing 11 will be simply described with reference to FIG. 3B.

<2-1> Step of Producing Flexible Printed Wiring Board

First, a plurality of power generation elements 122 are mounted on a pattern 121b.

Next, an adhesive is applied onto an entire region of an insulating substrate 121a and the pattern 121b except for regions where the power generation elements 122 are mounted.

Subsequently, resin sheet serving as a base of a coverlay 128 is disposed on the insulating substrate 121a and the pattern 121b. The resin sheet has holes at positions corresponding to the power generation elements 122. In a state where the insulating substrate 121a and the pattern 121b are covered with the resin sheet, a part of each of the power generation elements 122 protrudes from the corresponding hole.

The adhesive is then solidified, thereby fixing the resin sheet onto the insulating substrate 121a and the pattern 121b. In this case, the solidified adhesive corresponds to an insulating layer 126, and the resin sheet corresponds to the coverlay 128.

Lastly, a resin film 129 is formed by potting on boundary portions between each power generation element 122 and the coverlay 128. Thus, the flexible printed wiring board 12 is produced.

<2-2> Step of Attaching Flexible Printed Wiring Board to Housing

First, an adhesive serving as a base of an insulating layer 124 is applied onto a region where a flexible printed wiring board 12 is to be arranged, the region being disposed on a bottom surface 11a of a housing 11. In this case, when viewed from a direction orthogonal to the bottom surface 11a of the housing 11, the region where the adhesive is to be applied is determined to be larger than outer dimensions of the insulating substrate 121a in plan view.

Next, an insulating substrate 121a is placed on the region onto which the adhesive has been applied.

The adhesive is then solidified, thereby fixing the insulating substrate 121a to the region where the insulating substrate 121a is to be arranged, the region being disposed on the housing 11. In this case, the solidified adhesive corresponds to the insulating layer 124.

<3> With Regard to Performance in Withstand Voltage Test of Module

Next, performance in a withstand voltage test of the module 1M according to the present embodiment will be described.

Figure 4:
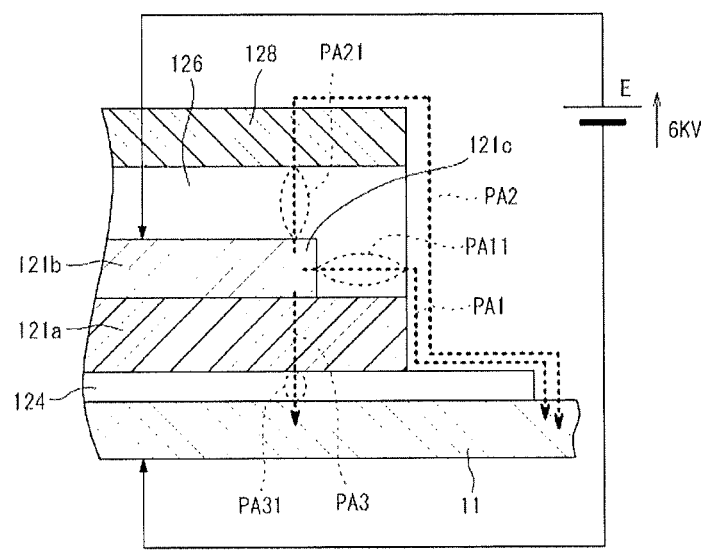
FIG. 4 is a schematic view of an AR2 portion in FIG. 3B, with regard to a concentrator photovoltaic module according to an embodiment.

FIG. 4 is a schematic view of an AR2 portion in FIG. 3B.

A dielectric voltage test with reference to the IEC62688 standard requires that, as shown in FIG. 4, in a case where a predetermined voltage (for example, 6 kV) is applied between the pattern 121b and the housing 11, dielectric breakdown does not occur between the pattern 121b and the housing 11.

In a case where a voltage is applied between the pattern 121b and the housing 11, three paths of PA1 to PA3 in FIG. 4 are mainly considered to be paths in which dielectric breakdown occurs.

The path PA1 extends from the pattern 121b to the housing 11 through the inside of the insulating layer 126. The path PA1 extends from an edge 121c of the pattern 121b, the edge 121c being located on a peripheral edge side of the insulating substrate 121a, to the housing 11 through the inside of the insulating layer 126.

The path PA2 extends from the pattern 121b to the housing 11 through the inside of the insulating layer 126 and the inside of the coverlay 128.

The path PA3 extends from the pattern 121b to the housing 11 through the inside of the insulating substrate 121a and the inside of the insulating layer 124.

As described above, at least one of the insulating layers 124 and 126, the insulating substrate 121a, and the coverlay 128 is included in the paths PA1 to PA3. That is, at least one of the insulating substrate 121a, the insulating layers 124 and 126, and the coverlay 128 is interposed between the pattern 121b and the housing 11. Accordingly, in the module 1M, the withstand voltage between the pattern 121b and the housing 11 can be improved compared with a module having a structure in which these are not interposed between the pattern and the housing.

In the step of applying an adhesive described in <2>, air bubbles and foreign substances are mixed in the adhesive to some extent. Therefore, air bubbles and foreign substances are present in the insulating layers 124 and 126 to some extent.

The withstand voltages of portions PA11 and PA21 which correspond to the inside of the insulating layer 126 in the paths PA1 and PA2, respectively, depend on an average volume of air bubbles or foreign substances present in the insulating layer 126. Specifically, the smaller the average volume of air bubbles or foreign substances, the more the withstand voltage in the portions PA11 and PA21 tends to improve. Similarly, the smaller the average volume of air bubbles or foreign substances present in the insulating layer 124, the more the withstand voltage of a portion PA31 which corresponds to the inside of the insulating layer 124 in the path PA3 tends to improve. The inventors of the present invention have found that, in the case where a voltage of 6 kV is applied between the pattern 121b and the housing 11 in the module 1M, dielectric breakdown does not occur when the average volume of air bubbles or foreign substances present in the insulating layers 124 and 126 is equal to or less than a volume of a sphere with a diameter of 1 mm. In this structure, an electric field easily concentrates on the edge 121c of the pattern 121b, the edge 121c being located on the peripheral edge side of the insulating substrate 121a. However, when the average volume of air bubbles or foreign substances present in the insulating layers 124 and 126 was determined as described above, dielectric breakdown did not occur. Specifically, dielectric breakdown did not occur in the path extending from the edge 121c of the pattern 121b, the edge 121c being located on the peripheral edge side of the insulating substrate 121a, to the housing 11 through the inside of the insulating layer 126. For example, an ultrasonic microscope that uses ultrasonic waves having a frequency in the range of 10 to 500 MHz (for example, HSAM220, manufactured by Hitachi Construction Machinery Fine Tech Co., Ltd.) can be used for measuring the volume of air bubbles or foreign substances present in the insulating layers 124 and 126.

In view of the above finding, the average volume of air bubbles or foreign substances present in the insulating layers 124 and 126 is preferably equal to or less than the volume of a sphere with a diameter of 1 mm. In this case, the module 1M easily satisfies the IEC62688 standard in the dielectric voltage test.

Furthermore, the average volume of air bubbles or foreign substances present in the insulating layers 124 and 126 can be controlled by using a detection limit of air bubbles or foreign substances by an ultrasonic microscope.

For example, it is assumed that neither an air bubble nor a foreign substance present in the insulating layers 124 and 126 could be detected by an ultrasonic microscope that uses ultrasonic waves of several tens of MHz. In this case, it can be determined that an air bubble or a foreign substance having a volume equal to or less than a volume of a sphere with a diameter of at least 100 μm is not present in the insulating layers 124 and 126.

Similarly, it is assumed that neither an air bubble nor a foreign substance present in the insulating layers 124 and 126 could be detected by an ultrasonic microscope that uses ultrasonic waves of several hundreds of MHz. In this case, it can be determined that an air bubble or a foreign substance having a volume equal to or less than a volume of a sphere with a diameter of at least 10 μm is not present in the insulating layers 124 and 126.

Accordingly, the average volume of air bubbles or foreign substances present in the insulating layers 124 and 126 is set to be, for example, equal to or less than the volume of a sphere with a diameter of 100 µm or the volume of a sphere with a diameter of 10 µm. In this case, the size of air bubbles or foreign substances present in the insulating layers 124 and 126 can be controlled on the basis that whether or not the air bubbles or the foreign substances can be detected by an ultrasonic microscope.

<Supplement>

Next, structural features of the flexible printed wiring board 12 in the module 1M will be described.

Figure 5:
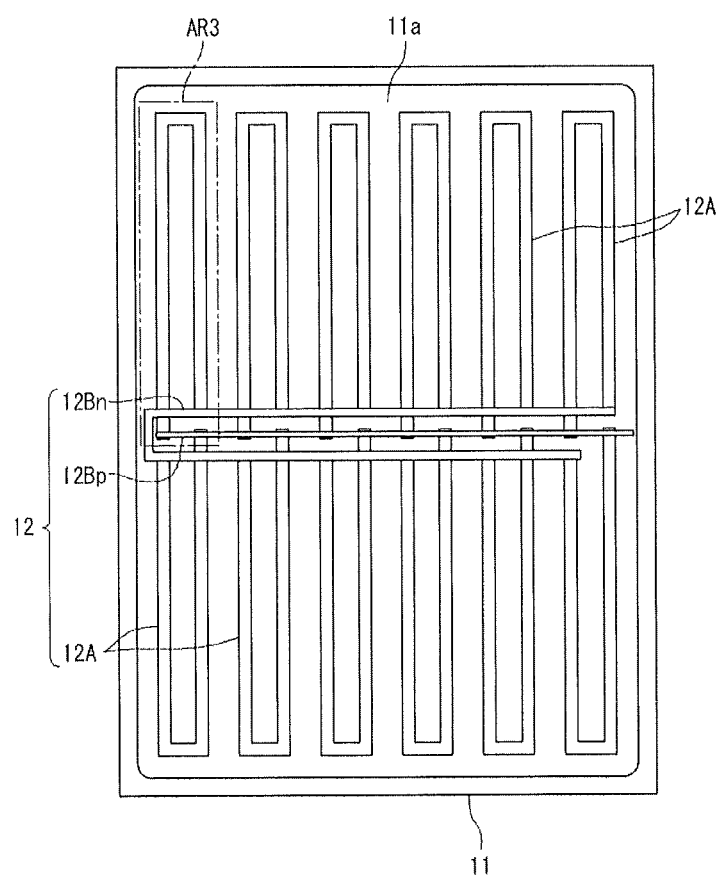
FIG. 5 is a plan view showing a state in which a primary concentrating portion 13 is detached, with regard to a concentrator photovoltaic module according to an embodiment.

FIG. 5 is a plan view showing a state in which a primary concentrating portion 13 is detached, with regard to a module 1M. In FIG. 5, power generation elements 122 are omitted.

A flexible printed wiring board 12 includes twelve wiring boards 12A for power generation and two wiring boards 12Bp and 12Bn for connection, the wiring boards 12Bp and 12Bn being separated from the wiring boards 12A for power generation.

Figure 6:
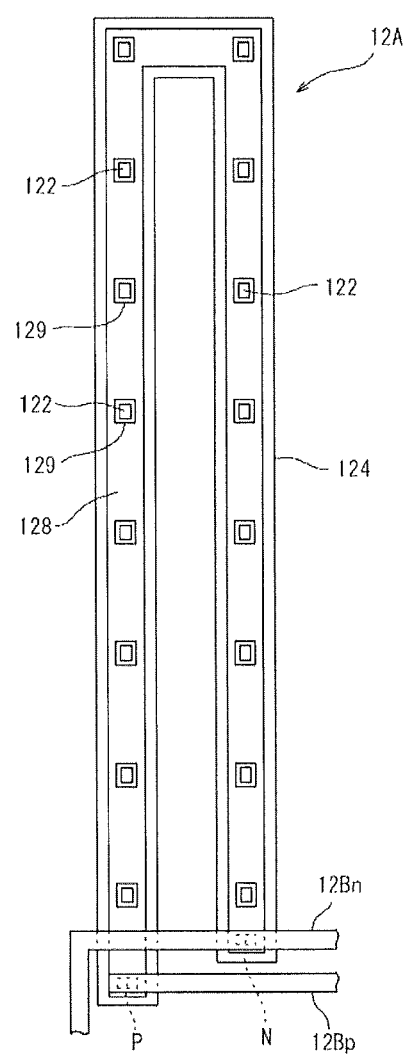
FIG. 6 shows a concentrator photovoltaic module according to an embodiment and is an enlarged view of an AR3 portion in FIG. 5.

FIG. 6 shows a module 1M and is an enlarged view of an AR3 portion in FIG. 5.

A wiring board 12A for power generation is formed so as to have substantially a U-shape. A plurality of (sixteen in FIG. 6) power generation elements 122 are mounted on the wiring board 12A for power generation along a direction in which the wiring board 12A is stretched. These power generation elements 122 are connected to each other in series. When a voltage generated in a single power generation element 122 is assumed to be 2.5 V, a single wiring board 12A for power generation can generate a voltage of 40 V (2.5 V×16). This voltage is generated between a positive-side electrode P and a negative-side electrode N that are provided on two ends in a direction in which the wiring board 12A for power generation is stretched.

The wiring board 12Bp for connection electrically connects positive-side electrodes P of the respective wiring boards 12A for power generation together. Similarly, the wiring board 12Bn for connection electrically connects negative-side electrodes N of the respective wiring boards 12A for power generation together.

For example, in a step of producing a flexible printed wiring board or the like, with a reduction in the size of an object to be produced, a large production apparatus and the like become unnecessary, and thus the production can be easily conducted.

With regard to this, the flexible printed wiring board 12 according to the present embodiment is produced by separately preparing the wiring boards 12A for power generation and the wiring boards 12Bp and 12Bn for connection, and then connecting these wiring boards to each other. Furthermore, as shown in FIG. 5, the wiring boards 12A for power generation and the wiring boards 12Bp and 12Bn for connection constitute a part of the flexible printed wiring board 12, and are smaller than the whole flexible printed wiring board 12.

Thus, in the present embodiment, since the wiring boards 12A for power generation and the wiring boards 12Bp and 12Bn for connection can be separately prepared, the production can be easily performed.

<Modifications>

(1) In the embodiment, an example of a concentrator photovoltaic module 1M has been described. However, the power generation module is not necessarily limited to a concentrator module. Alternatively, the module may be a non-concentrator module, that is, may have a structure that does not include a concentrating portion.

(2) In the embodiment, a description has been made of an example in which the insulating layers 124 and 126 are composed of a resin material. However, the material of the insulating layers 124 and 126 is not necessarily limited to a resin material. For example, the insulating layers 124 and 126 may be composed of an insulating material such as glass or a ceramic.

It is to be understood that the embodiments disclosed herein are only illustrative and are not restrictive in all respects. The scope of the present invention is defined by the claims described below, and it is intended that the scope of the present invention includes equivalents of the claims and all modifications within the scope of the claims.

The invention claimed is:

1. A photovoltaic module comprising:
a vessel-shaped housing composed of a metal; and
a flexible printed wiring board provided so as to be in contact with an inner surface of the housing,
the flexible printed wiring board including
a first insulating layer that is in contact with the inner surface of the housing,
an insulating substrate provided in direct contact with a surface of the first insulating layer and having flexibility,
a pattern composed of a conductor and provided in direct contact with a surface of the insulating substrate,
a plurality of power generation elements mounted on the pattern, and
a second insulating layer provided so as to cover an entire surface of the pattern except for portions where the power generation elements are mounted,
wherein the first insulating layer is composed of a resin material which is adhesive, the first insulating layer has outer dimensions larger than outer dimensions of the insulating substrate in plan view, and an average volume of an air bubble or a foreign substance present in the first insulating layer is a first volume or less, so that dielectric breakdown does not occur in a first path extending from the pattern to the housing through any portion of the inside of the first insulating layer in a case where a voltage equal to or less than a predetermined voltage is applied between the pattern and the housing, or
the second insulating layer is composed of a resin material, and an average volume of an air bubble or a foreign substance present in the second insulating layer is a second volume or less, so that dielectric breakdown does not occur in a second path extending from the pattern to the housing through any portion of the inside of the second insulating layer in a case where a voltage equal to or less than a predetermined voltage is applied between the pattern and the housing.

2. The photovoltaic module according to claim 1,
wherein the flexible printed wiring board further includes
a covering layer provided so as to cover an entire upper part of the insulating substrate and the pattern except for portions where the power generation elements are mounted, and
the second insulating layer is interposed between the insulating substrate and the covering layer and between the pattern and the covering layer.

3. The photovoltaic module according to claim 1,
wherein the second path extends from an edge of the pattern, the edge being located on a peripheral edge side of the insulating substrate, to the housing through the inside of the second insulating layer.

4. The photovoltaic module according to claim 1,
wherein the first path further extends through the inside of the insulating substrate.

5. The photovoltaic module according to claim 1,
wherein the first volume and the second volume are each equal to or less than a volume of a sphere with a diameter of 1 mm.

6. The photovoltaic module according to claim 1,
wherein the first volume and the second volume are each equal to or less than a volume of a sphere with a diameter of 100 µm.

7. The photovoltaic module according to claim 1,
wherein the first volume and the second volume are each equal to or less than a volume of a sphere with a diameter of 10 µm.

8. The photovoltaic module according to claim 1,
wherein the insulating substrate has a ribbon shape.

9. The photovoltaic module according to claim 1,
wherein the flexible printed wiring board includes a plurality of wiring boards for power generation, the wiring boards each having at least one power generation element, and a wiring board for connection, the wiring board electrically connecting the plurality of wiring boards for power generation together.

10. The photovoltaic module according to claim 1,
wherein the insulating substrate has a thickness of 10 to 100 µm.

11. A photovoltaic panel comprising a combination of a plurality of the photovoltaic modules according to claim 1.

* * * * *